(12) United States Patent
Park et al.

(10) Patent No.: US 7,843,715 B2
(45) Date of Patent: Nov. 30, 2010

(54) MEMORY CELL OF A RESISTIVE SEMICONDUCTOR MEMORY DEVICE, A RESISTIVE SEMICONDUCTOR MEMORY DEVICE HAVING A THREE-DIMENSIONAL STACK STRUCTURE, AND RELATED METHODS

(75) Inventors: Joon-Min Park, Dongjak-gu (KR); Sang-Beom Kang, Hwaseong-si (KR); Hyung-Rok Oh, Yongin-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 220 days.

(21) Appl. No.: 12/015,624

(22) Filed: Jan. 17, 2008

(65) Prior Publication Data
US 2008/0175031 A1    Jul. 24, 2008

(30) Foreign Application Priority Data
Jan. 23, 2007    (KR) ...................... 10-2007-0006859

(51) Int. Cl.
*G11C 5/02* (2006.01)
(52) U.S. Cl. ..................... 365/51; 365/105; 365/175; 365/243; 365/63; 365/185.05
(58) Field of Classification Search ................ 365/51, 365/105, 175, 249, 63, 185.05, 243
See application file for complete search history.

(56) References Cited

U.S. PATENT DOCUMENTS

| 6,593,608 | B1 | 7/2003 | Sharma et al. | |
| 6,816,410 | B2 * | 11/2004 | Kleveland et al. | 365/185.03 |
| 6,984,548 | B2 * | 1/2006 | Lung et al. | 438/131 |
| 7,436,704 | B2 * | 10/2008 | Kim et al. | 365/185.05 |
| 7,450,415 | B2 * | 11/2008 | Kim et al. | 365/163 |
| 7,558,100 | B2 * | 7/2009 | Ahn et al. | 365/148 |
| 2006/0033182 | A1 | 2/2006 | Hsu | |
| 2006/0197115 | A1 * | 9/2006 | Toda | 257/248 |
| 2006/0203541 | A1 | 9/2006 | Toda | |
| 2007/0132049 | A1 * | 6/2007 | Stipe | 257/421 |

FOREIGN PATENT DOCUMENTS

WO     2004084228 A1    9/2004

* cited by examiner

*Primary Examiner*—Connie C Yoha
(74) *Attorney, Agent, or Firm*—Volentine & Whitt, PLLC

(57) ABSTRACT

A memory cell of a resistive semiconductor memory device, a resistive semiconductor memory device having a three-dimensional stack structure, and related methods are provided. The memory cell of a resistive semiconductor memory device includes a twin cell, wherein the twin cell stores data values representing one bit of data. The twin cell includes a main unit cell connected to a main bit line and a word line, and a sub unit cell connected to a sub bit line and the word line. Also, the main unit cell includes a first variable resistor and a first diode, and the sub unit cell includes a second variable resistor and a second diode.

17 Claims, 12 Drawing Sheets

MEMORY CELL OF A RESISTIVE SEMICONDUCTOR MEMORY DEVICE, A RESISTIVE SEMICONDUCTOR MEMORY DEVICE HAVING A THREE-DIMENSIONAL STACK STRUCTURE, AND RELATED METHODS

CROSS-REFERENCE TO RELATED APPLICATION

This application claims priority to Korean Patent Application No. 10-2007-0006859, filed Jan. 23, 2007, the subject matter of which is hereby incorporated by reference in its entirety.

BACKGROUND OF THE INVENTION

1. Field of the Invention

Embodiments of the invention relate to a semiconductor memory device, a memory cell of a semiconductor memory device, and a method for controlling the device. In particular, embodiments of the invention relate to a resistive semiconductor memory device having a three-dimensional stack structure, a memory cell of the resistive semiconductor memory device, and a method for controlling the device.

2. Description of Related Art

Because of the need for memory devices having relatively high storage capacity and relatively low power consumption, memory devices that are non-volatile and do not require refreshing are being studied. These memory devices, which are presently considered to be "next-generation" semiconductor devices, include phase change random access memory (PRAM) devices that each utilize a phase change material, resistive random access memory (RRAM) devices that each utilize a material having variable resistance characteristics (such as a transition metal oxide), magnetic random access memory (MRAM) devices that each utilize a ferromagnetic material, and ferroelectric random access memory (FRAM) devices that each utilize a ferroelectric material.

An MRAM device is a memory device in which data may be stored using the magnetization direction in tunnel junctions. In an MRAM device, the magnetization direction in a tunnel junction may be changed. An FRAM device is a memory device that stores data by exploiting the polarization characteristics of the ferroelectric material. Both of those types of devices have advantages and disadvantages, but both are being studied in the pursuit of memory devices having relatively high integration densities, relatively fast operation characteristics, relatively low power consumption, and improved data retention characteristics.

A PRAM device is a memory device that stores data by selectively changing a resistance value by selectively changing the phase of a phase change material. As used herein, the term "phase change material" refers to a material, such as chalcogenide, wherein the resistance of the material varies as its phase changes according to a change in temperature. Generally, $Ge_xSb_yTe_z$ which is an alloy of germanium (Ge), antimony (Sb), and tellurium (Te) is used as the phase change material.

The phase change material is well-adapted for use in a semiconductor memory device because the phase of the phase change material can be rapidly changed between two states (an amorphous state and a crystalline state) according to the temperature of the phase change material.

An RRAM device mainly stores data using the resistance conversion characteristic of a transition metal oxide. That is, the resistance value of a transition metal oxide can be changed according to a voltage applied to the transition metal oxide.

A memory cell structure of a resistive semiconductor memory device using a resistance conversion material may be a transistor structure or a diode structure. A transistor structure is a structure in which a transistor is employed as a switching element, and a diode structure is a structure in which a diode is employed as a switching element.

Compared to a semiconductor memory device using the transistor structure, a relatively high write current increasing exponentially according to an applied voltage can be applied in a semiconductor memory device using the diode structure for memory cells. Thus, a semiconductor memory device using the diode structure can avoid a limit on the size of a transistor, so the sizes of memory cells and even the size of an entire chip can be reduced more than in a semiconductor memory device using a transistor structure. Therefore, it is expected that demand for semiconductor memory devices using diode structures as memory cells and having relatively high integration densities, relatively high operation speeds, relatively low power consumption will increase.

FIG. 1 shows the memory cell structure of a conventional resistive semiconductor memory device.

As shown in FIG. 1, a memory cell M of the conventional resistive semiconductor memory device includes one diode D and one variable resistor R. Variable resistor R is formed from a transition metal oxide.

Diode D of memory cell M is connected between a word line WL and variable resistor R. For example, the cathode terminal of diode D is connected to word line WL and the anode terminal of diode D is connected to one end of variable resistor R. In addition, variable resistor R is connected between diode D and a bit line BL.

In a resistive semiconductor memory device having a memory cell M having the diode structure described above, variable resistor R functions as a data storage element, and a write operation is performed by exploiting the resistance characteristics of variable resistor R. In particular, a write operation is performed by exploiting the fact that the resistance of variable resistor R may change in accordance with the magnitude of a voltage applied to memory cell M through bit line BL. That is, when a write operation is performed on memory cell M, a voltage is supplied to memory cell M through bit line BL. In addition, if word line WL transitions to a low level or a ground level, a forward bias is applied to diode D to form a current path from bit line BL to word line WL.

The logic state stored in memory cell M after a write operation has been performed depends upon the level of the voltage applied to bit line BL during the write operation. For example, if a write voltage having a voltage level corresponding to a data value "0" is applied to memory cell M, then the data value "0" is written to memory cell M. Alternatively, if a write voltage having a voltage level corresponding to a data value "1" is applied to memory cell M, then the data value "1" is written to memory cell M.

In addition, in a read operation, the logic state of a data value stored in memory cell M may be determined by evaluating the amount of current flowing through memory cell M. That is, the logic state of the data value stored in memory cell M is determined by applying a read voltage having a predetermined voltage level to memory cell M and measuring the variation in the level of the current flowing from bit line BL to word line WL.

As the degree of integration of semiconductor memory devices gradually increases, the degree of integration of resistive semiconductor memory devices having memory cells having the diode structure also increases. However, the degree of integration of a semiconductor memory device having a two-dimensional structure is approaching an upper limit.

Further, since memory cells of the resistive memory device described above have various resistance distributions, a sensing margin for accurately sensing the data value "0" and the data value "1" cannot be sufficiently guaranteed.

SUMMARY OF THE INVENTION

Embodiments of the invention provide a memory cell of a resistive semiconductor memory device, a resistive semiconductor memory device having a three-dimensional stack structure, and a method for controlling the resistive semiconductor memory device. The resistive semiconductor memory device, in accordance with an embodiment of the invention, may have a relatively high degree of integration, and may sense a data value stored in a memory cell more reliably than a conventional device and therefore may have improved reliability.

In one embodiment, the invention provides a memory cell of a resistive semiconductor memory device, wherein the memory cell comprises a twin cell, and wherein the twin cell stores data values representing one bit of data. The twin cell comprises a main unit cell connected to a main bit line and a word line, and a sub unit cell connected to a sub bit line and the word line. Also, the main unit cell comprises a first variable resistor and a first diode, and the sub unit cell comprises a second variable resistor and a second diode.

In another embodiment, the invention provides a resistive semiconductor memory device having a three-dimensional stack structure, the resistive semiconductor memory device comprising a plurality of bit line layers comprising a plurality of main bit line layers and a plurality of sub bit lines alternately stacked, wherein each of the plurality of main bit line layers comprises a plurality of main bit lines and each of the plurality of sub bit line layers comprises a plurality of sub bit lines; a plurality of memory cell layers each disposed between corresponding main and sub bit line layers and comprising a plurality of memory cells each comprising a main unit cell and a sub unit cell; and a plurality of word line layers disposed in the plurality of memory cell layers, respectively, and each comprising a plurality of word lines each shared by main unit cells and sub unit cells of a predetermined number of corresponding memory cells.

In a further embodiment, the invention provides a resistive semiconductor memory device having a three-dimensional stack structure, the resistive semiconductor memory device comprising a plurality of array block layers each comprising a main bit line layer, a memory cell layer comprising a main unit cell layer, a sub unit cell layer, and a word line layer interposed therebetween and shared thereby, and a sub bit line layer sequentially stacked. In each of the plurality of array block layers, the main bit line layer may comprise a plurality of main bit lines, the sub bit line layer may comprise a plurality of sub bit lines, the main unit cell layer may comprise a plurality of main unit cells, and the sub unit cell layer may comprise a plurality of sub unit cells. In each memory cell layer, each of pairs of main and sub unit cells neighboring each other along a vertical direction may form a memory cell.

In yet another embodiment, the invention provides a method for performing a write operation in a semiconductor memory device having a three-dimensional stack structure and comprising a plurality of main bit lines, a plurality of sub bit lines, a plurality of word lines, and a plurality of memory cells each comprising a main cell and a sub unit cell sharing one word line. The method comprises selecting a main bit line, a sub bit line, and a word bit line connected to a memory cell to select the memory cell; applying a main bias voltage corresponding to a data value having a first logic level, a sub bias voltage corresponding a data value having a second logic level opposite to the first logic level, and a ground voltage to the selected main bit line, the selected sub bit line, and the selected word line, respectively, and simultaneously, applying the ground voltage, the ground voltage, and a disable voltage having a voltage level higher than the main bias voltage to unselected main bit lines, unselected sub bit lines, and unselected word lines, respectively.

In still another embodiment, the invention provides a method for performing a read operation in a semiconductor memory device having a three-dimensional stack structure and comprising a plurality of main bit lines, a plurality of sub bit lines, a plurality of word lines, and a plurality of memory cells each comprising a main unit cell and a sub unit cell sharing one word line. The method comprises selecting a main bit line, a sub bit line, and a word bit line connected to a memory cell to select the memory cell; applying a read bias voltage to the selected main bit line and the selected sub bit line and a ground voltage to the selected word line, and simultaneously, applying the ground voltage to unselected main bit lines and unselected sub bit lines and the read bias voltage to unselected word lines; and comparing a voltage level apparent on the selected main bit line to a voltage level apparent on the selected sub bit line and determining whether the selected memory cell is storing a first data value having a first logic level or a second data value having a second data level.

BRIEF DESCRIPTION OF THE DRAWINGS

Embodiments of the invention will be described herein with reference to the accompanying drawings, in which.

DESCRIPTION OF EMBODIMENTS

Figure 1:
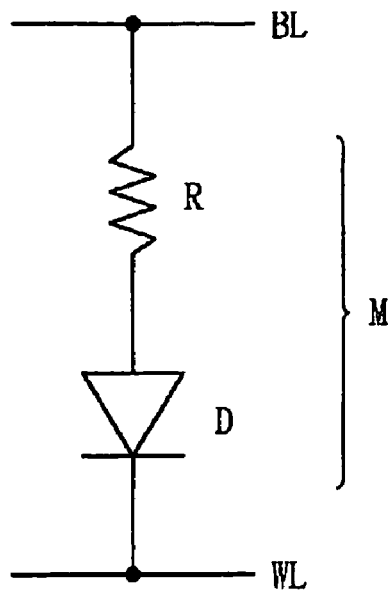
FIG. 1 is a circuit diagram of a memory cell of a conventional resistive semiconductor memory device.

In the drawings, like reference symbols indicate like or similar components throughout.

Figure 2:
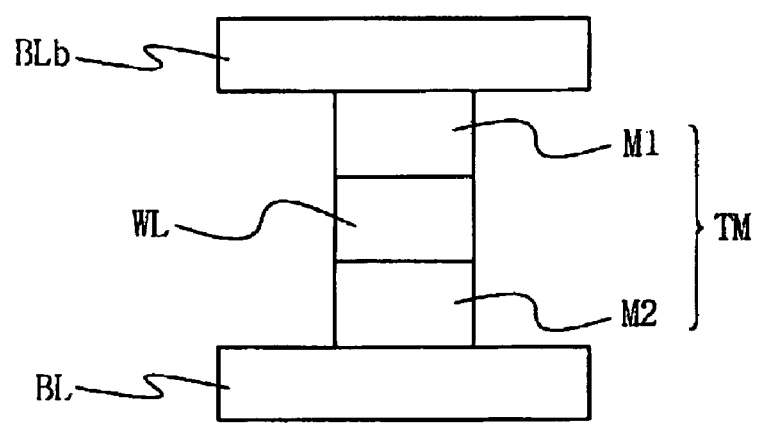
FIG. 2 illustrates the structure of a memory cell of a resistive semiconductor memory device in accordance with an embodiment of the invention.

FIG. 2 illustrates the structure of a memory cell of a resistive semiconductor memory device in accordance with an embodiment of the invention.

As shown in FIG. 2, a memory cell TM in accordance with an embodiment of the invention has a twin cell structure. Thus, memory cell TM can store one more bit of data than a conventional memory cell (e.g., conventional memory cell M of FIG. 1). Memory cell TM comprises a main unit cell M2 connected to a main bit line BL and a sub unit cell M1 connected to a sub bit line BLb. In addition, main unit cell M2 and sub unit cell M1 are each connected to a word line WL (that is, they are each connected to the same word line WL). While the conventional memory cell M described above (with reference to FIG. 1) has one diode D and one variable resistor R, memory cell TM in accordance with an embodiment of the invention has a structure in which main unit cell M2 comprises a diode and a variable resistor and sub unit cell M1 comprises a diode and a variable resistor. In addition, main unit cell M2 and sub unit cell M1 have a vertical stack structure.

That is, while main bit line BL and sub bit line BLb each extend in a first direction and word line WL extends in a second direction orthogonal to the first direction, main unit cell M2 and sub unit cell M1 are separated from one another along a third direction orthogonal to the first and second directions.

When the term "vertical" is used herein relative to a device or component, it means vertical with respect to the orientation of the device or component as illustrated in the drawings. Likewise, terms such as "upper," "lower," "above," and "below" are used herein with reference to the orientation of components as illustrated in the drawings.

Figure 3:
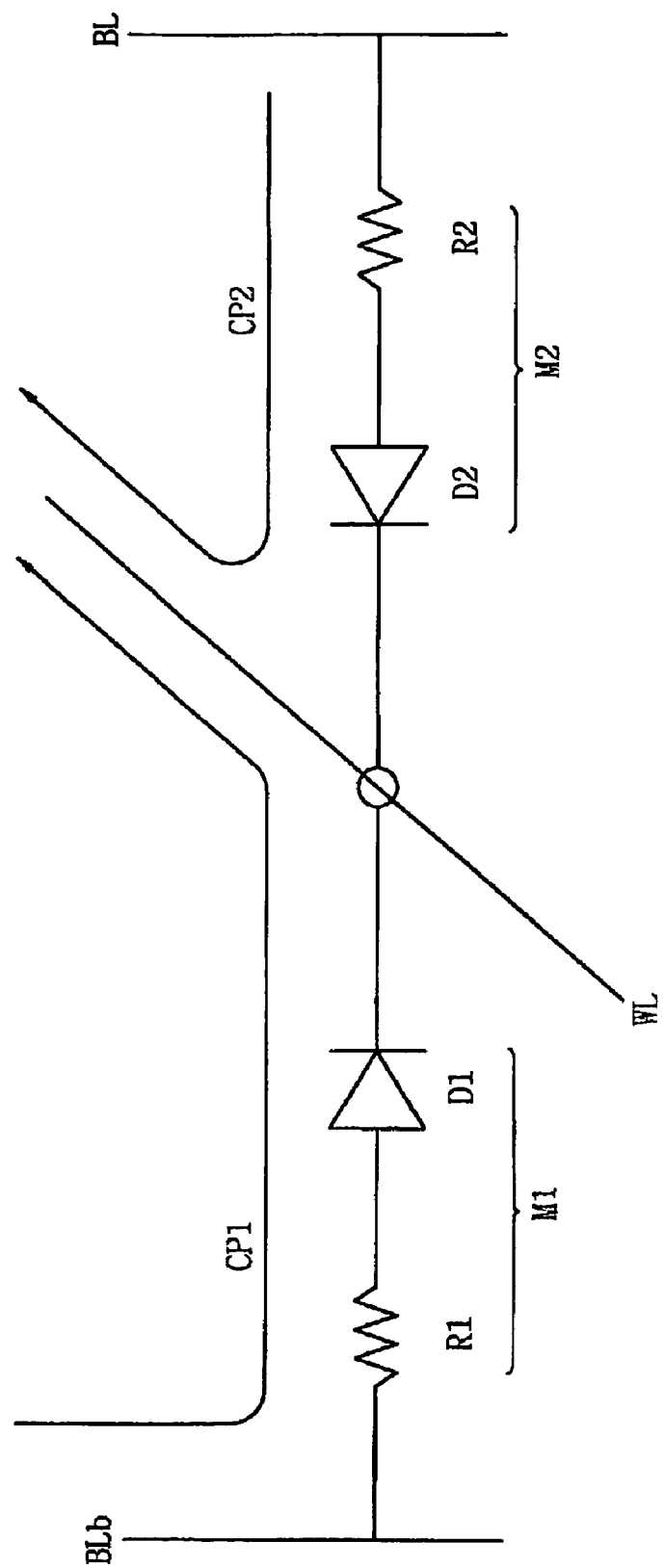
FIG. 3 is an equivalent circuit diagram of the memory cell of FIG. 2.

FIG. 3 is an equivalent circuit diagram of the memory cell illustrated in FIG. 2.

As shown in FIG. 3, memory cell TM comprises main unit cell M2 and sub unit cell M1. Main unit cell M2 comprises a variable resistor R2 and a diode D2, and sub unit cell M1 comprises a variable resistor R1 and a diode D1. A first terminal of variable resistor R2 is connected to main bit line BL and a second terminal of variable resistor R2 is connected to diode D2 of main unit cell M2. Further, the cathode terminal of diode D2 is connected to word line WL and the anode terminal of diode D2 is connected to variable resistor R2.

In addition, a first terminal of variable resistor R1 is connected to sub bit line BLb and a second terminal of variable resistor R1 is connected to diode D1. Further, the cathode terminal of diode D1 is connected to word line WL and the anode terminal of diode D1 is connected to variable resistor R1.

The respective structures of main unit cell M2 and sub unit cell M1 are symmetrical (i.e., vertically symmetrical) with respect to word line WL. In main unit cell M2, current flows through diode D2 from main bit line BL to word line WL. Similarly, in sub unit cell M1, current flows through diode D1 from sub bit line BLb to word line WL.

Main unit cell M2 and sub unit cell M1 of memory cell TM may respectively store data values having opposite logic levels. For example, if the data value "1" is stored in main unit cell M2, the data value "0" may be stored in sub unit cell M1. Alternatively, if the data value "0" is stored in main unit cell M2, the data value "1" may be stored in sub unit cell M1. As used herein, logic levels "1" and "0" are opposite logic levels. In addition, when a unit cell is said to store a data value "1", it means that the unit cell stores a data value having the logic level "1". Likewise, when a unit cell is said to store a data value "0", it means that the unit cell stores a data value having the logic level "0".

The logic level of the data value stored in memory cell TM may be defined as either the data value stored in main unit cell M2 or the data value stored in sub unit cell M1. For example, when the data value stored in memory cell TM is defined as the data value stored in main unit cell M2, memory cell TM stores the data value "1" whenever main unit cell M2 stores the data value "1", and memory cell TM stores the data value "0" whenever main unit cell M2 stores the data value "0". In the same way, the data value stored in memory cell TM may be defined as the data value stored in sub unit cell M1.

In describing the embodiments set forth below, it will be assumed that the data value stored in memory cell TM is defined as the data value stored in main unit cell M2. In addition, the data stored in main unit cell M2 may be referred to herein as "main data" and the data stored in sub unit cell M1 may be referred to herein as "sub data".

To store the data value "1" in memory cell TM, a bias voltage having a voltage level corresponding to the data value "1" is applied to main bit line BL (to which main unit cell M2 is connected) and word line WL is grounded. Further, a bias voltage having a voltage level corresponding to the data value "0" is applied to sub bit line BLb (to which sub unit cell M1 is connected). Accordingly, a current path CP2 reaching word line WL through variable resistor R2 and diode D2 of main unit cell M2 is formed, and a current path CP1 reaching word line WL via variable resistor R1 and diode D1 of sub unit cell M1 is formed. Therefore, the data value "1", which is the main data in this example, is stored in main unit cell M2, and the data value "0", which is the sub data in this example, is stored in sub unit cell M1. As used herein, when a bias voltage is said to have a voltage level "corresponding" to a particular data value, it means that, when the bias voltage is applied to a bit line connected to a unit cell and the unit cell is also connected to a word line that is grounded, the particular data value will be written to the unit cell.

To store the data value "0" in memory cell TM, a writing operation is performed in which the bias voltages mentioned above are applied to the opposite bit lines relative to the writing operation described above. That is, the bias voltage having the voltage level corresponding to the data value "0" is applied to main bit line BL, the bias voltage corresponding to the data value "1" is applied to sub bit line BLb, and word line WL is grounded. Accordingly, a current path CP2 reaching word line WL through variable resistor R2 and diode D2 of main unit cell M2 is formed, and a current path CP1 reaching word line WL through variable resistor R1 and diode D1 of sub unit cell M1 is formed. Thus, the data value "0", which is the main data in this example, is stored in main unit cell M2, and the data value "1", which is the sub data in this example, is stored in sub unit cell M1.

A read operation for memory cell TM will be described below.

A bias voltage for a data read operation is simultaneously applied to main bit line BL to which main unit cell M2 is connected and sub bit line BLb to which sub unit cell M1 is connected. In addition, word line WL is grounded. Accordingly, a current path CP2 reaching word line WL through variable resistor R2 and diode D2 of main unit cell M2 is formed, and a current path CP1 reaching word line WL through variable resistor R1 and diode D1 of sub unit cell M1 is formed. The respective voltage levels apparent on main bit line BL and sub bit line BLb change in accordance with the respective amounts of current flowing through current paths CP1 and CP2.

Then, the voltage level apparent on main bit line BL corresponding to the main data is sensed relative to the voltage level apparent on sub bit line BLb corresponding to the sub data. That is, the main data (i.e., the data value stored in main unit cell M2) is sensed by determining whether the voltage level apparent on main bit line BL is higher or lower than the voltage level apparent on sub bit line BLb.

For example, if the voltage level apparent on main bit line BL is higher than the voltage level apparent on sub bit line BLb, it may be determined that the main data is the data value "1" (i.e., that main unit cell M2 stores the data value "1"), and if the voltage level apparent on main bit line BL is lower than the voltage level apparent on sub bit line BLb, it may be determined that the main data is the data value "0" (i.e., that main unit cell M2 stores the data value "0").

Figure 4:
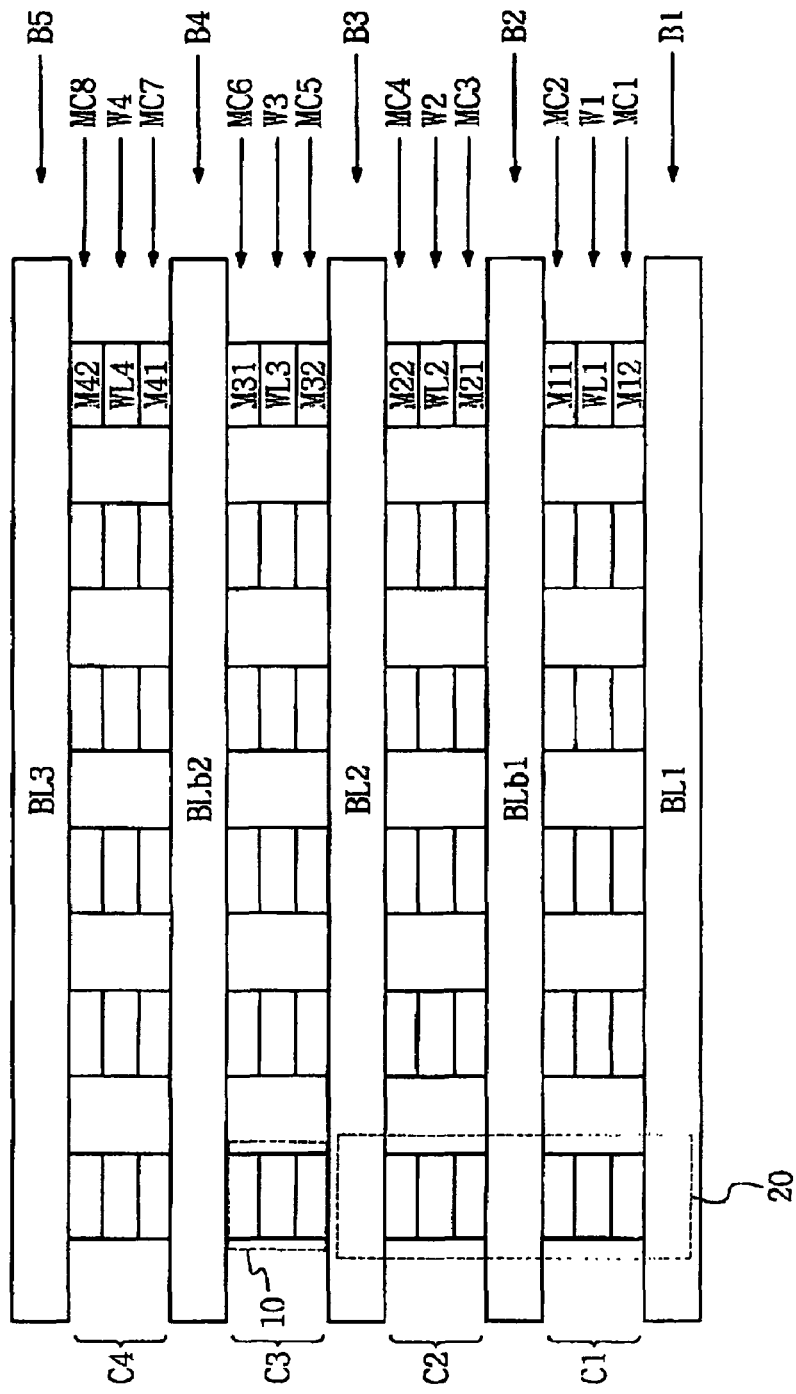
FIG. 4 is a schematic view illustrating a resistance semiconductor memory device, in accordance with an embodiment of the invention, having a three-dimensional stack structure and having memory cells having the structure of the memory cell illustrated in FIG. 2.
Figure 7:
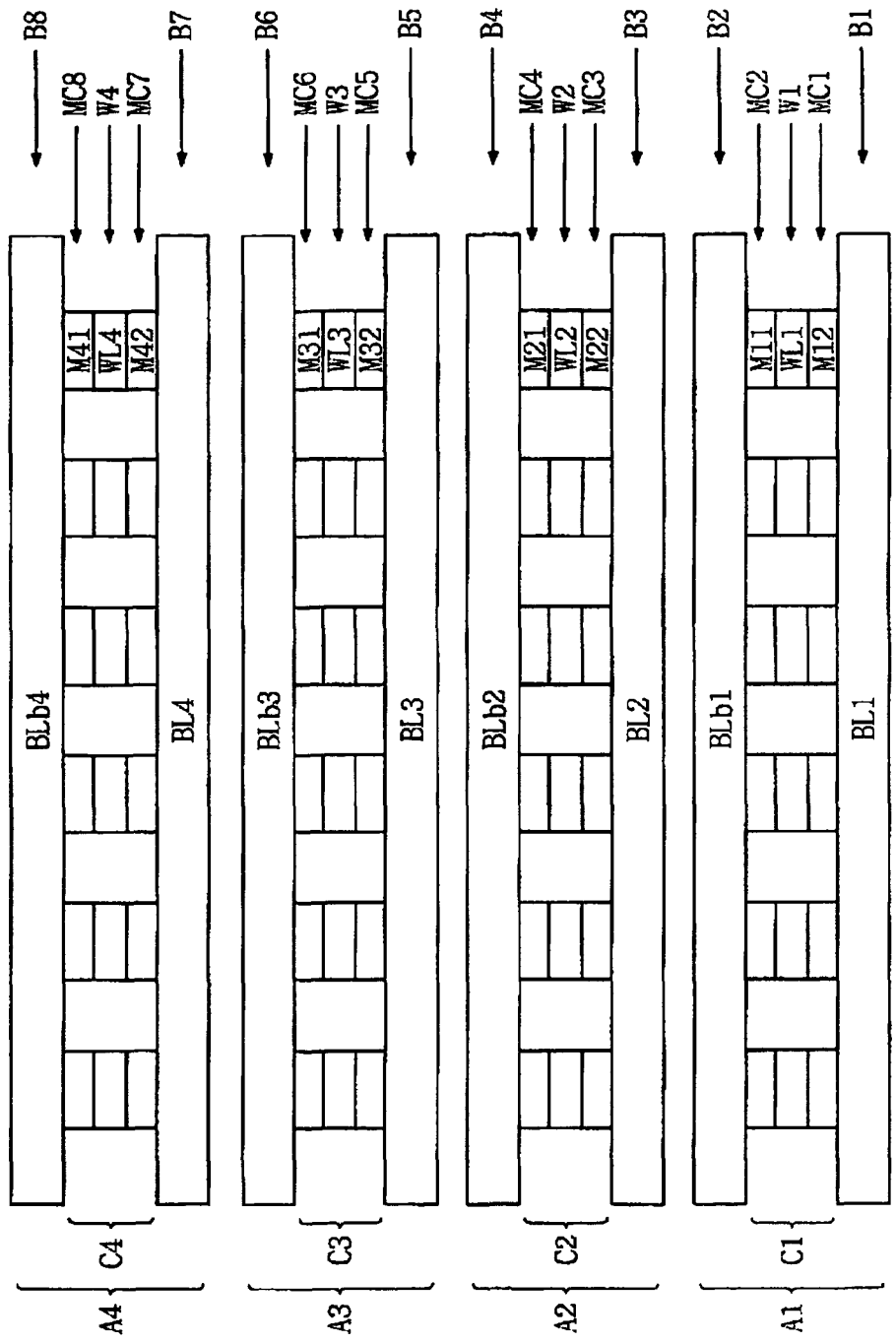
FIG. 7 is a schematic view illustrating a resistance semiconductor memory device, in accordance with another embodiment of the invention, having a three-dimensional stack structure and having memory cells having the structure of the memory cell illustrated in FIG. 2.

FIG. 4 schematically shows a resistive semiconductor memory device, in accordance with an embodiment of the invention, in which memory cells having the structure of memory cell TM illustrated in FIG. 2 form a three-dimensional stack structure. FIG. 7 also illustrates a resistive semiconductor memory device, in accordance with an embodiment of the invention, having a three-dimensional stack structure. The semiconductor memory devices of FIGS. 4 and 7 will be described herein with reference to a first direction, a second direction orthogonal to the first direction, and a third direction orthogonal to the first and second directions. The first through third directions of FIG. 2 correspond to the first through third directions of FIGS. 4 and 7. In the embodiments illustrated in FIGS. 4 and 7, the first direction extends between a left and a right side of each of those figures, the second direction extends into the page of each of those figures, and the third direction extends between a top and a bottom side of each of those figures. In addition, as used herein, the term "vertical" and related terminology corresponds to the third direction. Also, the first direction may be defined as the X-direction, the second direction may be defined as the Y-direction, and the third direction may be defined as the Z-direction.

As illustrated in FIG. 4, the resistive semiconductor memory device having the three-dimensional stack structure comprises a plurality of vertically stacked bit line layers B1, B2, B3, B4, and B5; a plurality of memory cell layers C1, C2, C3, and C4; and a plurality of word line layers W1, W2, W3, and W4.

Memory cell layers C1, C2, C3, and C3 respectively comprise word line layers W1, W2, W3, and W4. That is, word line layers W1, W2, W3, and W4 are disposed in memory cell layers C1, C2, C3, and C3, respectively. In addition, as illustrated in FIG. 4, each of memory cell layers C1, C2, C3, and C4 is disposed between a pair of bit lines among bit line layers B1, B2, B3, B4, and B5. For example, memory cell layer C1 is disposed between bit line layers B1 and B2, memory cell layer C2 is disposed between bit line layers B2 and B3, etc. That is, bit line layers B1, B2, B3, B4, and B5 and memory cell layers C1, C2, C3, and C4 are arranged vertically with respect to one another, and are arranged in an alternating pattern.

In addition, main bit lines BL and sub bit lines BLb are disposed in alternate bit line layers of bit line layers B1, B2, B3, B4, and B5. For example, a plurality of first main bit lines BL1 may be disposed in first bit line layer B1, which is the lowermost layer in FIG. 4. Also, first main bit lines BL1 may extend in a first direction. First main bit lines BL1 disposed in first bit line layer B1 may have an arrangement similar to an arrangement of bit lines disposed in a semiconductor memory device having a conventional planar structure (i.e., a conventional two-dimensional structure). As used herein, when a component is said to "extend" in one of the first through third directions, it means that the length of the component is greater along the one of the first through third directions than the length of the component along either of the other two of the first through third directions. For example, when a component is said to extend in the first direction, it means that the length of the component in the first direction is greater than the length of the component in either of the second and third directions.

A plurality of first sub bit lines BLb1 may be disposed in second bit line layer B2 disposed above first bit line layer B1, and the first sub bit lines BLb1 may extend in the first direction. In addition, first sub bit lines BLb1 disposed in second bit line layer B2 may overlap first main bit lines BL1. As used herein, when a first bit line is said to "overlap" a second bit line, it means that the first bit line is disposed above the second bit line with respect to the third direction and is aligned with the second bit line.

In addition, a plurality of second main bit lines BL2 may be disposed in third bit line layer B3 disposed above second bit line layer B2, a plurality of second sub bit lines BLb2 may be disposed in fourth bit line layer B4 disposed above third bit line layer B3, and a plurality of third main bit lines BL3 may be disposed in fifth bit line layer B5 disposed above fourth bit line layer B4. In addition, each bit line of the plurality of second main bit lines BL2, the plurality of second sub bit lines BLb2, and the plurality of third main bit lines BL3 may extend in the first direction. Also, second main bit lines BL2 may overlap first main bit lines BL1 and first sub bit lines BLb1. Second sub bit lines BLb2 may overlap first main bit lines BL1, first sub bit lines BLb1, and second main bit lines BL2. Also, third main bit lines BL3 may overlap first main bit lines BL1, first sub bit lines BLb1, second main bit lines BL2, and second sub bit lines BLb2.

A plurality of memory cells is disposed in first memory cell layer C1 between first bit line layer B1 and second bit line layer B2. First memory cell layer C1 comprises a first unit cell layer MC1 and a second unit cell layer MC2 disposed above first unit cell layer MC1. Further, first word line layer W1 is disposed between first unit cell layer MC1 and second unit cell layer MC2. In addition, each of the memory cells illustrated in FIG. 4 (such as memory cell 10, for example) corresponds to memory cell TM of FIGS. 2 and 3 and comprises a main unit cell and a sub unit cell each connected to the same word line, like memory cell TM of FIGS. 2 and 3.

Main unit cells M12 connected to first main bit lines BL1 are disposed in first unit cell layer MC1 and sub unit cells M11 connected to first sub bit lines BLb1 are disposed in second unit cell layer MC2. In FIG. 4, each unit cell layer comprises a plurality of main unit cells or a plurality of sub unit cells, although only one unit cell of each unit cell layer is labeled in FIG. 4. In addition, each word line layer comprises a plurality of word lines, although only one word line of each word line layer is labeled in FIG. 4.

First word lines WL1 are disposed in first word line layer W1 and extend in the second direction. First word lines WL1 may have an arrangement similar to an arrangement of word lines in a semiconductor memory device having a conventional planar structure (i.e., a conventional two-dimensional structure). Each first word line WL1 corresponds to a main unit cell M12 of first unit cell layer MC1 and a sub unit cell M11 of second unit cell layer MC2. Each first word line WL1 and its corresponding main unit cell M12 and sub unit cell M11 may be arranged and connected as described with reference to memory cell TM of FIGS. 2 and 3.

In addition, a plurality of memory cells is disposed in second memory cell layer C2 between second bit line layer B2 and third bit line layer B3. Second memory cell layer C2 comprises a third unit cell layer MC3 and a fourth unit cell layer MC4 disposed above third unit cell layer MC3. Further, second word line layer W2 is disposed between third unit cell layer MC3 and fourth unit cell layer MC4.

Sub unit cells M21 connected to first sub bit lines BLb1 are disposed in third unit cell layer MC3, and main unit cells M22 connected to second main bit lines BL2 are disposed in fourth unit cell layer MC4.

Second word lines WL2 are disposed in second word line layer W2 and extend in the second direction. In addition, second word lines WL2 may overlap first word lines WL1.

Each second word line WL2 corresponds to a sub unit cell M21 of third unit cell layer MC3 and a main unit cell M22 of fourth unit cell layer MC4. Each second word line WL2 and its corresponding sub unit cell M21 and main unit cell M22 may be arranged and connected in a manner analogous to the manner described with reference to memory cell TM of FIGS. 2 and 3 (although, for example, main unit cell M22 is disposed above sub unit cell M21 in the embodiment illustrated in FIG. 4).

A plurality of memory cells is disposed in third memory cell layer C3 between third bit line layer B3 and fourth bit line layer B4. Third memory cell layer C3 comprises a fifth unit cell layer MC5 and a sixth unit cell layer MC6 disposed above fifth unit cell layer MC5. Further, third word line layer W3 is disposed between fifth unit cell layer MC5 and sixth unit cell layer MC6.

Main unit cells M32 connected to second main bit lines BL2 are disposed in fifth unit cell layer MC5, and sub unit cells M31 connected to second sub bit lines BLb2 are disposed in sixth unit cell layer MC6.

In addition, third word lines WL3 are disposed in third word line layer W3 and extend in the second direction. Third word lines WL3 may overlap first word lines WL1 and second word lines WL2.

Each of third word lines WL3 corresponds to a main unit cell M32 of fifth unit cell layer MC5 and a sub unit cell M31 of sixth unit cell layer MC6. Each third word line WL3 and its corresponding main unit cell M32 and sub unit cell M31 may be arranged and connected as described with reference to memory cell TM of FIGS. 2 and 3.

A plurality of memory cells is disposed in fourth memory cell layer C4 between fourth bit line layer B4 and fifth bit line layer B5. Fourth memory cell layer C4 comprises a seventh unit cell layer MC7 and an eighth unit cell layer MC8 disposed above seventh unit cell layer MC7. Further, fourth word line layer W4 is disposed between seventh unit cell layer MC7 and eighth unit cell layer MC8.

Sub unit cells M41 connected to second sub bit lines BLb2 are disposed in seventh unit cell layer MC7, and main unit cells M42 connected to third main bit lines BL3 are disposed in eighth unit cell layer MC8.

Fourth word lines WL4 are disposed in fourth word line layer W4 and extend in the second direction. Fourth word lines WL4 may overlap first word lines WL1, second word lines WL2, and third word lines WL3.

Each of fourth word lines WL4 corresponds to a sub unit cell M41 of seventh unit cell layer MC7 and a main unit cell M42 of eighth unit cell layer MC8. Each fourth word line WL4 and its corresponding sub unit cell M41 and main unit cell M42 may be arranged and connected in a manner analogous to the manner described with reference to memory cell TM of FIGS. 2 and 3 (although, for example, main unit cell M42 is disposed above sub unit cell M41 in the embodiment illustrated in FIG. 4).

In addition, the resistive semiconductor memory device illustrated in FIG. 4 may be enlarged along the third direction by adding additional layers on top of fifth bit line layer B5 in accordance with the arrangement of layers illustrated in FIG. 4.

In the resistive semiconductor memory device of FIG. 4, two main unit cells that are separated from one another along the third direction by a main bit line are both connected to the main bit line separating them. For example, as illustrated in FIG. 4, a main unit cell M22 and a main unit cell M32 that are separated from one another along the third direction by a second main bit line BL2 are both connected to second main bit line BL2. Further, two sub unit cells that are separated from one another along the third direction by a sub bit line are both connected to the sub bit line separating them. For example, as illustrated in FIG. 4, a sub unit cell M11 and a sub unit cell M21 that are separated from one another along the third direction by a first sub bit line BL1$b$ are both connected to first sub bit line BL1$b$.

In addition, first sub bit lines BLb1 disposed in second bit line layer B2 are connected to (and held between) the memory cells of first memory cell layer C1 and the memory cells of second memory cell layer C2. Also, second main bit lines BL2 disposed in third bit line layer B3 are connected to (and held between) the memory cells of second memory cell layer C2 and the memory cells of the third memory cell layer C3. Further, second sub bit lines BLb2 disposed in fourth bit line layer B4 are connected to (and held between) the memory cells of third memory cell layer C3 and the memory cells of fourth memory cell layer C4.

Figure 5:
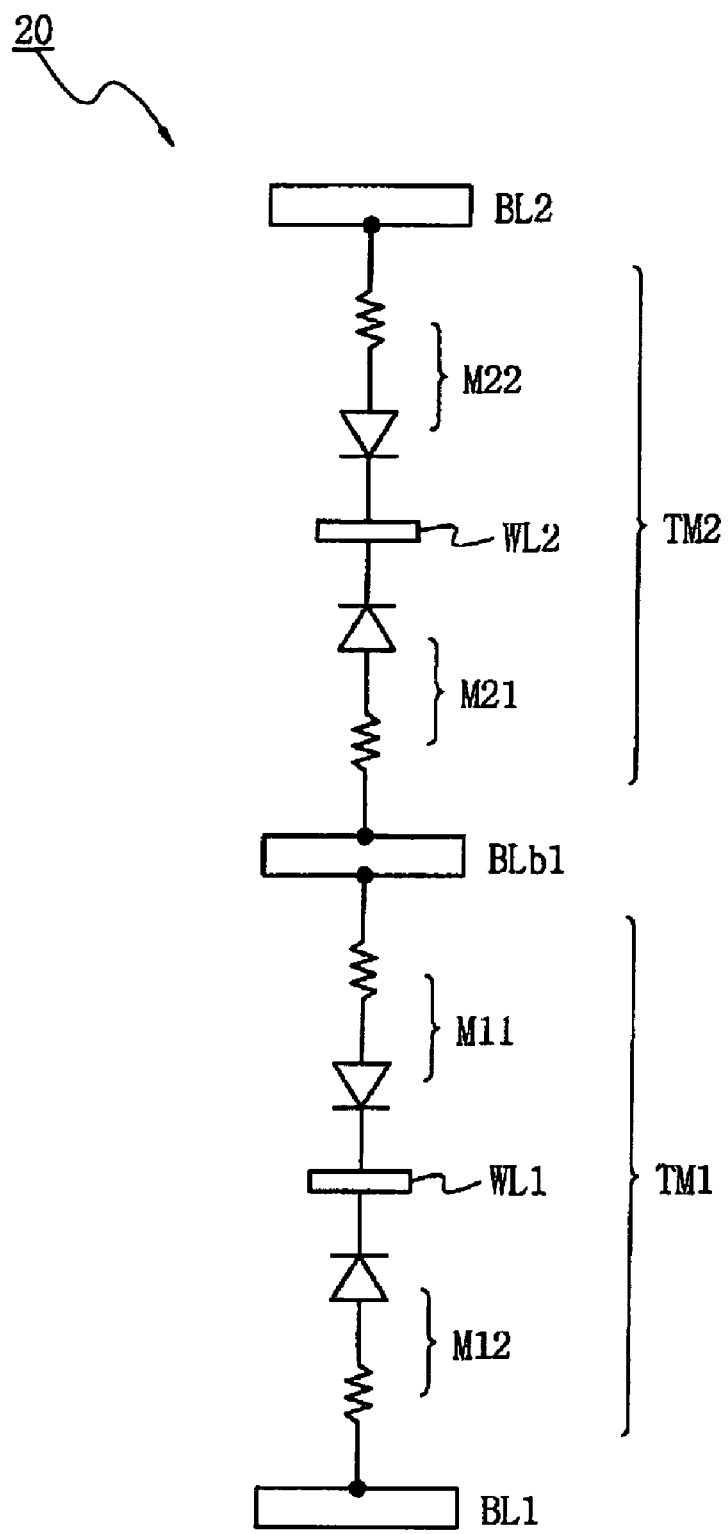
FIG. 5 illustrates a portion of the resistance semiconductor memory device of FIG. 4 in more detail.

The structure of a section 20 of the resistive semiconductor memory device illustrated in FIG. 4 will be explained in some additional detail with reference to FIG. 5. As illustrated in FIG. 5, a memory cell TM1 having a structure like the structure of the memory cell illustrated in FIG. 3 is connected to first word line WL1 and is connected between first main bit line BL1 of first bit line layer B1 and first sub bit line BLb1 of second bit line layer B2. Further, a memory cell TM2 having a structure like the structure of the memory cell illustrated in FIG. 3 is connected to second word WL2 and is connected between first sub bit line BLb1 and second main bit line BL2 of third bit line layer BL3.

The selection of a memory cell in the resistive semiconductor memory device illustrated in FIG. 4 having a three-dimensional stack structure will now be described. To select a memory cell in the resistive semiconductor memory device illustrated in FIG. 4, two bit line layers that are adjacent to one another along the third direction and that have the memory cell layer comprising the memory cell to be selected disposed between them are selected. Further, a main bit line and a sub bit line, to which the memory cell is connected, are selected from the two adjacent bit line layers, and the memory cell is selected by selecting a word line connected to both the main unit cell and the sub unit cell of the memory cell.

Hereinafter, as an example, an operation for selecting memory cell 10 of third memory cell layer C3 will be explained. To select memory cell 10, second main bit line BL2, which is connected to memory cell 10, is selected from third bit line layer B3, and second sub bit line BLb2, which is connected to memory cell 10, is selected from fourth bit line layer B4. Further, memory cell 10 is selected by selecting one word line WL3 of third word line layer W3, wherein the one word line WL3 is connected to main unit cell M32 and sub unit cell M31 of memory cell 10.

Figure 6:
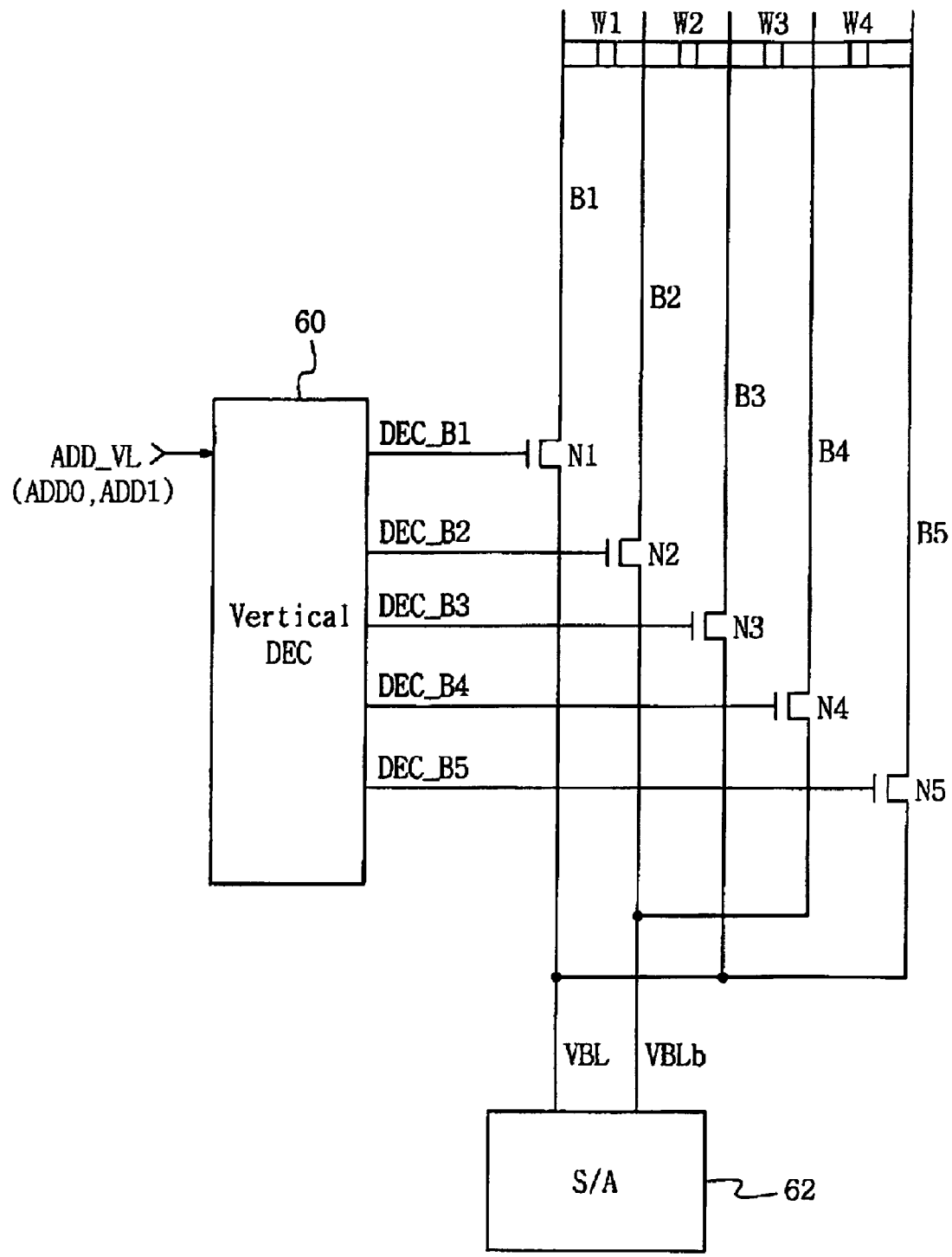
FIG. 6 illustrates a decoding circuit, in accordance with an embodiment of the invention, that corresponds to the resistance semiconductor memory device illustrated in FIG. 4.

The selection among bit line layers B1, B2, B3, B4, and B5 for selecting a memory cell is performed by a vertical decoder 60 (see FIG. 6). The selection of a memory cell using vertical decoder 60 will be described with reference to FIG. 6.

Referring to FIG. 6, vertical decoder 60 is a decoder that selects two bit line layers from among bit line layers B1, B2, B3, B4, and B5 in response to a vertical address ADD_VL comprising address bit ADD0 and address bit ADD1. In the embodiment illustrated in FIG. 6, first to fifth switching elements N1, N2, N3, N4, and N5 are individually switched by decoding signals DEC_B1, DEC_B2, DEC_B3, DEC_B4, and DEC_B5, respectively. Each of first to fifth switching elements N1, N2, N3, N4, and N5 may be an NMOS transistor, and first to fifth switching elements N1, N2, N3, N4, and N5 are used to select bit line layers B1, B2, B3, B4, and B5, respectively, in response to vertical address ADD_VL. That is, in response to vertical address ADD_VL, vertical decoder 60 may select two bit line layers that are adjacent along the third direction by generating two decoding signals among decoding signals DEC_B1, DEC_B2, DEC_B3, DEC_B4, and DEC_B5. As used herein, vertical decoder 60 "selects" a bit line layer by generating a decoding signal provided to the switching element corresponding to the bit line layer.

As an example, when address bit ADD0 of vertical address ADD_VL is "0" and address bit ADD1 of vertical address ADD_VL is "0", then decoding signal DEC_B1 is generated to turn ON first transistor N1 and select first bit line layer B1 and decoding signal DEC_B2 is generated to turn ON second transistor N2 and select second bit line layer B2.

Likewise, when address bit ADD0 of vertical address ADD_VL is "0" and address bit ADD1 of vertical address ADD_VL is "1", then decoding signal DEC_B2 is generated to turn ON second transistor N2 and select second bit line layer B2 and decoding signal DEC_B3 is generated to turn ON third transistor N3 and select third bit line layer B3. Further, when address bit ADD0 of vertical address ADD_VL is "1" and address bit ADD1 of vertical address ADD_VL is "0", then decoding signal DEC_B3 is generated to turn ON third transistor N3 and select third bit line layer B3 and decoding signal DEC_B4 is generated to turn ON fourth transistor N4 and select fourth bit line layer B4. In addition, when address bit ADD0 of vertical address ADD_VL is "1" and address bit ADD1 of vertical address ADD_VL is "1", then decoding signal DEC_B4 is generated to turn ON fourth transistor N4 and select fourth bit line layer B4 and decoding signal DEC_B5 is generated to turn ON fifth transistor N5 and select fifth bit line layer B5.

FIG. 7 schematically illustrates a resistive semiconductor memory device, in accordance with another embodiment of the invention, in which memory cells that each have a structure similar to the structure of memory cell TM of FIGS. 2 and 3 form a three-dimensional stack structure. Each memory cell illustrated in FIG. 7 comprises a main unit cell connected to a word line and a sub unit cell connected to the same word line.

As shown in FIG. 7, the resistive semiconductor memory device having the three-dimensional stack structure comprises a plurality of vertically stacked array block layers A1, A2, A3, and A4. Array block layers A1, A2, A3, and A4 comprise a plurality of bit line layers B1, B2, B3, B4, B5, B6, B7, and B8; a plurality of memory cell layers C1, C2, C3, and C4; and a plurality of word line layers W1, W2, W3, and W4. Bit line layers B1 through B8 may be referred to as first through eighth bit line layers B1 through B8.

Each of array block layers A1, A2, A3, and A4 may comprise two bit line layers, one memory cell layer, and one word line layer. In the embodiment illustrated in FIG. 7, the two bit line layers are a main bit line layer comprising main bit lines and a sub bit line layer adjacent to the main bit line layer along the third direction that comprises sub bit lines.

The memory cell layer is disposed between the main bit line layer and the sub bit line layer, and the memory cell layer comprises a plurality of memory cells. Further, the word line layer is disposed in the memory cell layer and comprises word lines that are connected to (and held between) the main unit cells and the sub unit cells of the memory cells.

A first array block layer A1 of array block layers A1, A2, A3, and A4 comprises a first bit line layer B1, a second bit line layer B2, a first memory cell layer C1, and a first word line layer W1. In the embodiment illustrated in FIG. 7, first array block layer A1 is the lowermost layer.

First bit line layer B1 comprises a plurality of first main bit lines BL1, wherein each of the first main bit lines extends in the first direction. First main bit lines BL1 disposed in first bit line layer B1 may have an arrangement similar to an arrangement of bit lines disposed in a semiconductor memory device having a conventional planar structure (i.e., a conventional two-dimensional structure). Further, second bit line layer B2 disposed above first bit line layer B1 comprises a plurality of first sub bit lines BLb1, each extending in the first direction. First sub bit lines BLb1 disposed in second bit line layer B2 may overlap first main bit lines BL1. In another embodiment, first sub bit lines BLb1 may be disposed in first bit line layer B1 and first main bit lines BL1 may be disposed in second bit line layer B2.

A plurality of memory cells is disposed in first memory cell layer C1 between first bit line layer B1 and second bit line layer B2. First memory cell layer C1 comprises a first unit cell layer MC1 and a second unit cell layer MC2 disposed above first unit cell layer MC1. Further, first word line layer W1 is disposed between first unit cell layer MC1 and second unit cell layer MC2.

Main unit cells M12 connected to first bit lines BL1 are disposed in first unit cell layer MC1 and sub unit cells M11 connected to first sub bit lines BLb1 are disposed in second unit cell layer MC2. In FIG. 7, each unit cell layer comprises a plurality of main unit cells or a plurality of sub unit cells, although only one unit cell of each unit cell layer is labeled in FIG. 7. In addition, each word line layer comprises a plurality of word lines, although only one word line of each word line layer is labeled in FIG. 7.

First word lines WL1 are disposed in first word line layer W1 and extend in the second direction. First word lines WL1 may have an arrangement similar to an arrangement of word lines in a semiconductor memory device having a conventional planar structure (i.e., a conventional two-dimensional structure). Each first word line WL1 corresponds to a predetermined number of main unit cells M12 of first unit cell layer MC1 and a predetermined number of sub unit cells M11 of second unit cell layer MC2. Each first word line WL1 and its corresponding main unit cells M12 and sub unit cells M11 may be arranged and connected as described with reference to memory cell TM of FIGS. 2 and 3.

As illustrated in FIG. 7, each of second through fourth array block layers A2 through A4 is arranged in substantially the same way as first array block layer A1 described above. In addition, second array block layer A2 is disposed above first array block layer A1, third array block layer A3 is disposed above second array block layer A2, and fourth array block layer A4 is disposed above third array block layer A3. Elements in FIGS. 4 and 7 having the same reference symbol may also have the same name.

In addition, upper bit lines disposed in any one of second through eighth bit line layers B2 through B8 may overlap lower bit lines disposed in any bit line layer of first through seventh bit line layers B1 through B7 that is disposed below the upper bit lines.

In addition, the resistive semiconductor memory device of FIG. 7 may be expanded along the third direction to comprise one or more additional array block layers on top of fourth array block layer A4.

Unlike the resistive semiconductor memory device illustrated in FIG. 4, the resistive semiconductor memory device illustrated in FIG. 7 has a structure in which no two memory cell layers are connected to the same bit line layer. That is, the resistive semiconductor memory device of FIG. 7 comprises array block layers, wherein each array block layer comprises a main bit line layer, a sub bit line layer, and a memory cell layer, wherein the memory cell layer is connected to the main bit line layer and the sub bit line layer, and neither the main bit line layer nor the sub bit line layer is connected to a memory cell layer of another array block layer.

The selection of a memory cell in the resistive semiconductor memory device of FIG. 7 having the three-dimensional stack structure will now be described. Selecting a memory cell comprises selecting the array block layer of array block layers A1, A2, A3, and A4, in which the memory cell to be selected is disposed. When the array block layer is selected, two bit line layers, which are adjacent to one another in the third direction and have the memory cell layer of the array block layer interposed between them, are simultaneously selected. The memory cell layer of the array block layer comprises the memory cell to be selected. In addition, a main bit line and a sub bit line, to which the memory cell is connected, are selected from the two bit line layers in the selected array block layer, and the memory cell is selected by selecting a word line connected to both the main unit cell and the sub unit cell of the memory cell.

Figure 8:
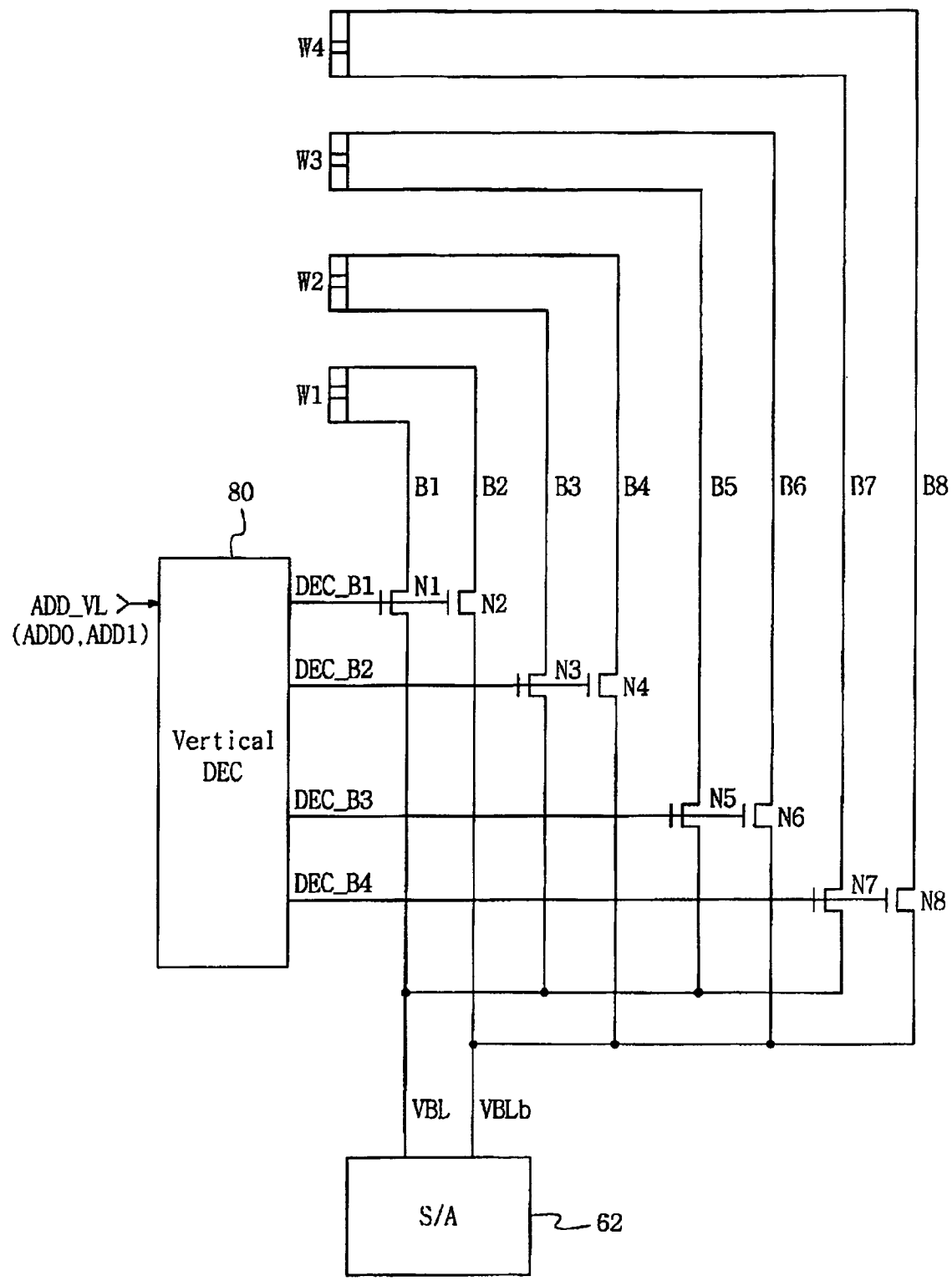
FIG. 8 illustrates a decoding circuit, in accordance with an embodiment of the invention, that corresponds to the resistance semiconductor memory device illustrated in FIG. 7.

Referring to FIG. 8, a vertical decoder 80 selects bit line layers from bit line layers B1, B2, B3, B4, B5, B6, B7, and B8 to select a memory cell. Selecting bit line layers using vertical decoder 80 will be described with reference to FIG. 8.

Referring to FIG. 8, vertical decoder 80 is a decoder that selects two bit line layers of bit line layers B1, B2, B3, B4, B5, B6, B7, and B8 in response to a vertical address ADD_VL. In the embodiment illustrated in FIG. 8, vertical decoder 80 switches switching elements among first to eighth switching elements N1, N2, N3, N4, N5, N6, N7, and N8 in response to vertical address ADD_VL to select bit line layers among bit line layers B1, B2, B3, B4, B5, B6, B7, and B8. First to eighth switching elements N1 to N8 may be NMOS transistors, for example, and pairs of switching elements among first to eighth switching elements N1 to N8 form groups respectively corresponding to array block layers. Vertical decoder 80 of FIG. 8 may select two bit line layers by enabling one of decoding signals DEC_B1, DEC_B2, DEC_B3, and DEC_B4 in response to a vertical address ADD_VL corresponding to the array block layer to be selected. As used herein, vertical decoder 80 "selects" a bit line layer by generating a decoding signal provided to the switching elements corresponding to the bit line layers.

For example, when data bit ADD0 of vertical address ADD_VL has the data value "0" and data bit ADD1 of vertical address ADD_VL has the data value "0", a decoding signal DEC_B1 for selecting first and second bit line layers B1 and B2 is generated to turn ON first and second transistors N1 and N2 to select first and second bit line layers B1 and B2. Similarly, when data bit ADD0 of vertical address ADD_VL has the data value "0" and data bit ADD1 of vertical address ADD_VL has the data value "1", a decoding signal DEC_B2 is generated to simultaneously select the third and fourth bit line layers B3 and B4. Likewise, when data bit ADD0 of vertical address ADD_VL has the data value "1" and data bit ADD1 of vertical address ADD_VL has the data value "0", a decoding signal DEC_B3 is generated to simultaneously select the fifth and sixth bit line layers B5 and B6. Similarly, when data bit ADD0 of vertical address ADD_VL has the data value "1" and data bit ADD1 of vertical address ADD_VL has the data value "1", a decoding signal DEC_B4 is generated to simultaneously select the seventh and eighth bit line layers B7 and B8.

Vertical decoder 80 is able to select two bit line layers using only one decoder signal, whereas vertical decoder 60 of FIG. 6 uses two decoder signals to select two bit line layers.

Figure 9:
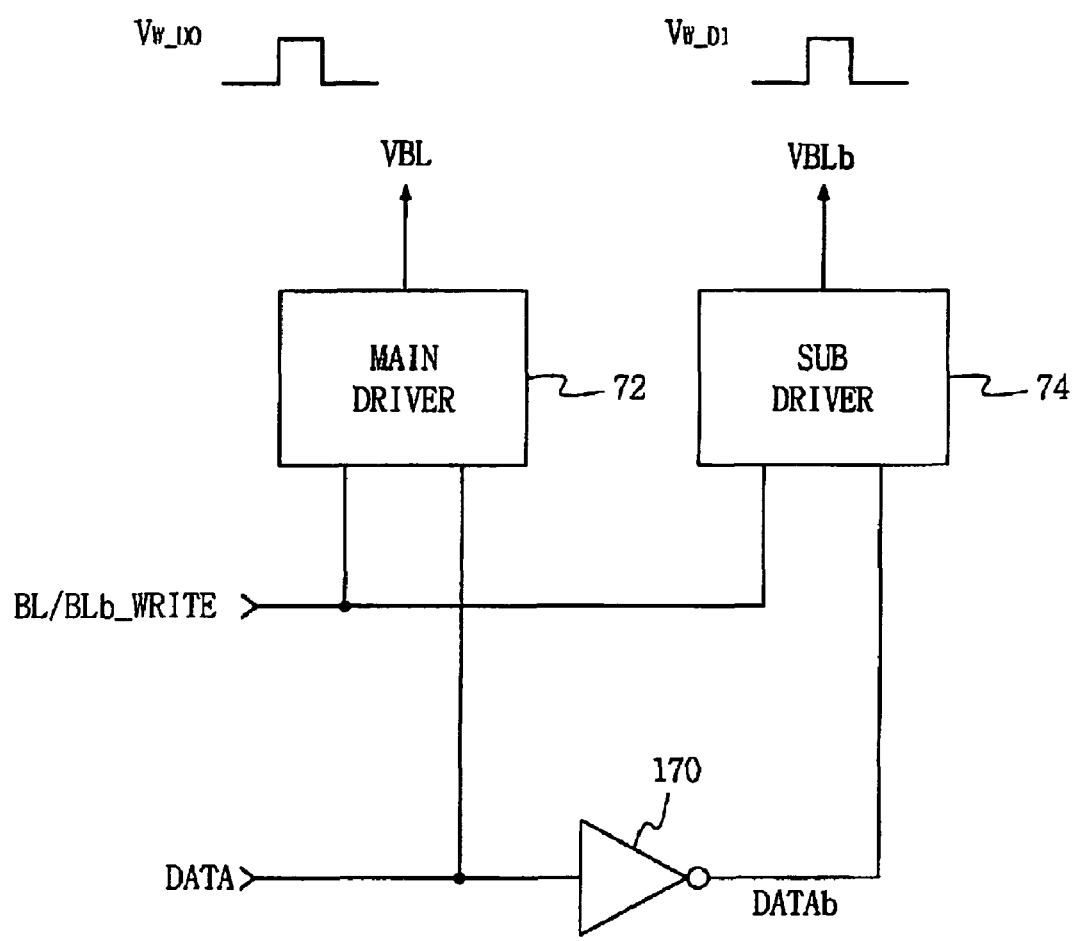
FIG. 9 is a block diagram illustrating a write driver circuit that performs write operations for the resistive semiconductor memory devices of FIGS. 4 and 7.
Figure 10:
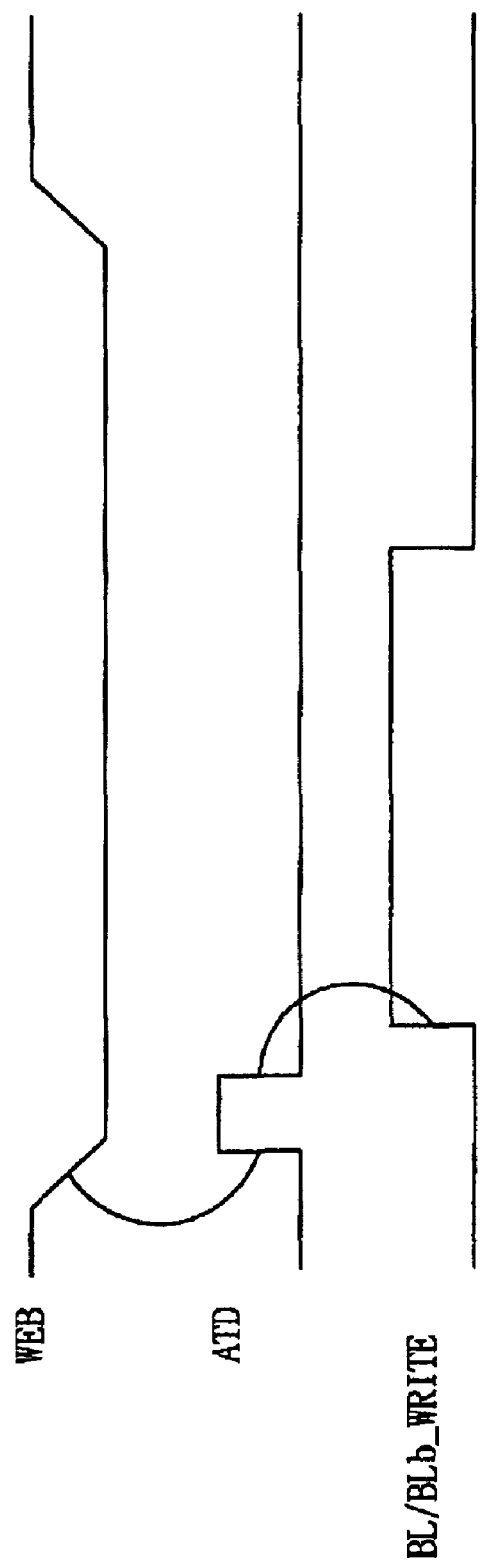
FIG. 10 is a timing diagram illustrating the generation of a write enable signal for the operation of the write driver circuit illustrated in FIG. 9.

FIG. 9 illustrates write driver, which outputs voltages used in performing a write operation for a resistive semiconductor memory device having a structure in accordance with the structure of either the resistive semiconductor memory device of FIG. 4 or the resistive semiconductor memory device of FIG. 7. FIG. 10 is a timing diagram showing the generation of a write enable signal for the operation of write driver.

Write driver illustrated in FIG. 9 outputs voltages used in performing a write operation on a memory cell TM (see FIGS. 2 and 3). As illustrated in FIG. 9, write driver comprises a main driver 72, which, during a write operation, provides a main bit line voltage VBL to a main bit line BL connected to a main unit cell of memory cell TM. Write driver of FIG. 9 further comprises a sub driver 74, which, during a write operation, provides a sub bit line voltage VBLb to a sub bit line BLb connected to a sub unit cell of memory cell TM. Main data DATA that is to be written to memory cell TM is input to main driver 72, and sub data DATAb, which is obtained by inverting main data DATA using an inverter 170, is input to sub driver 74.

As an example, a write operation for storing the data value "0" in a memory cell TM will be described.

Referring to FIGS. 9 and 10, when a write enable signal WEB is enabled and an address transition detection signal ATD is generated, a driver enable signal BL/BLb_WRITE is enabled in response to the generation of address transition detection signal ATD. Accordingly, main driver 72 provides a bias voltage $V_{W\_D0}$ (i.e., a bias voltage pulse $V_{W\_D0}$) as main bit line voltage VBL to a main bit line BL in order to store the data value "0" in the main unit cell connected to main bit line BL. At the same time, sub driver 74 applies a bias voltage $V_{W\_D1}$ (i.e., a sub voltage pulse $V_{W\_D1}$) as sub bit line voltage VBLb to a sub bit line BLb in order to store the data value "1" in the sub unit cell connected to sub bit line BLb. Bias voltage $V_{W\_D0}$ has a voltage level corresponding to main data DATA, which is the data value "0" in this example, and bias voltage $V_{W\_D1}$ has a voltage level corresponding to sub data DATAb, which is the data value "1" in this example. In FIG. 10, write enable signal WEB is enabled when it has a logic low level.

Figure 11:
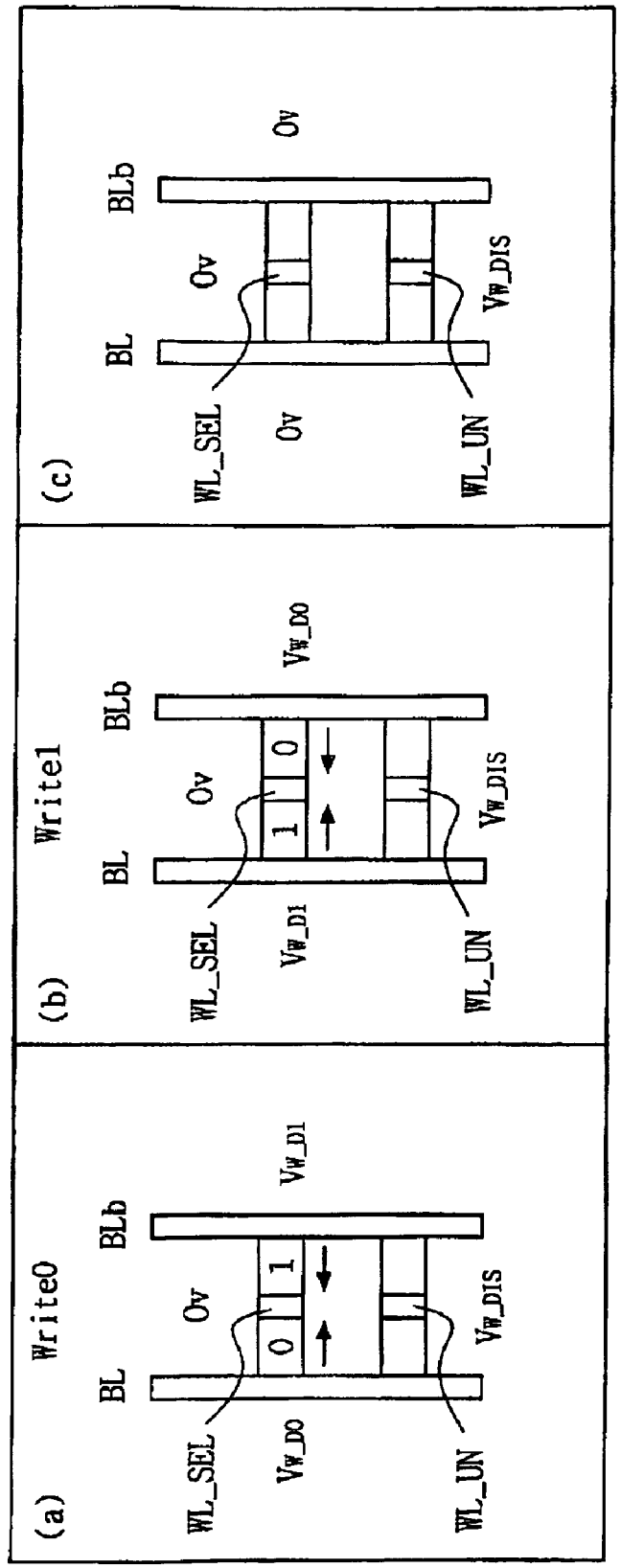
FIG. 11 shows three diagrams illustrating respective bias voltage levels applied during write operations to a main bit line, a sub bit line, and word lines each connected to memory cells.
Figure 12:
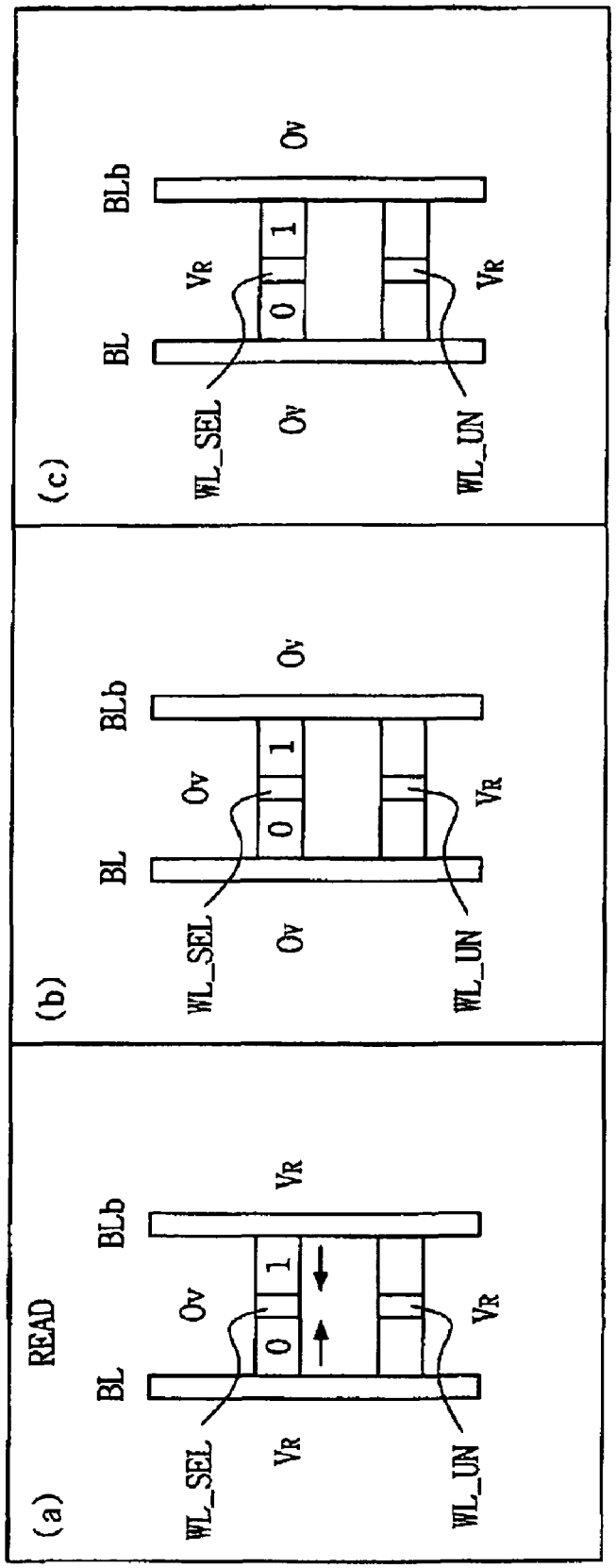
FIG. 12 shows three diagrams illustrating respective bias voltage levels applied during read operations to a main bit line, a sub bit line, and word lines each connected to memory cells; and, FIG. 13 is a timing diagram showing a read operation, a write operation, and a standby state.
Figure 13:
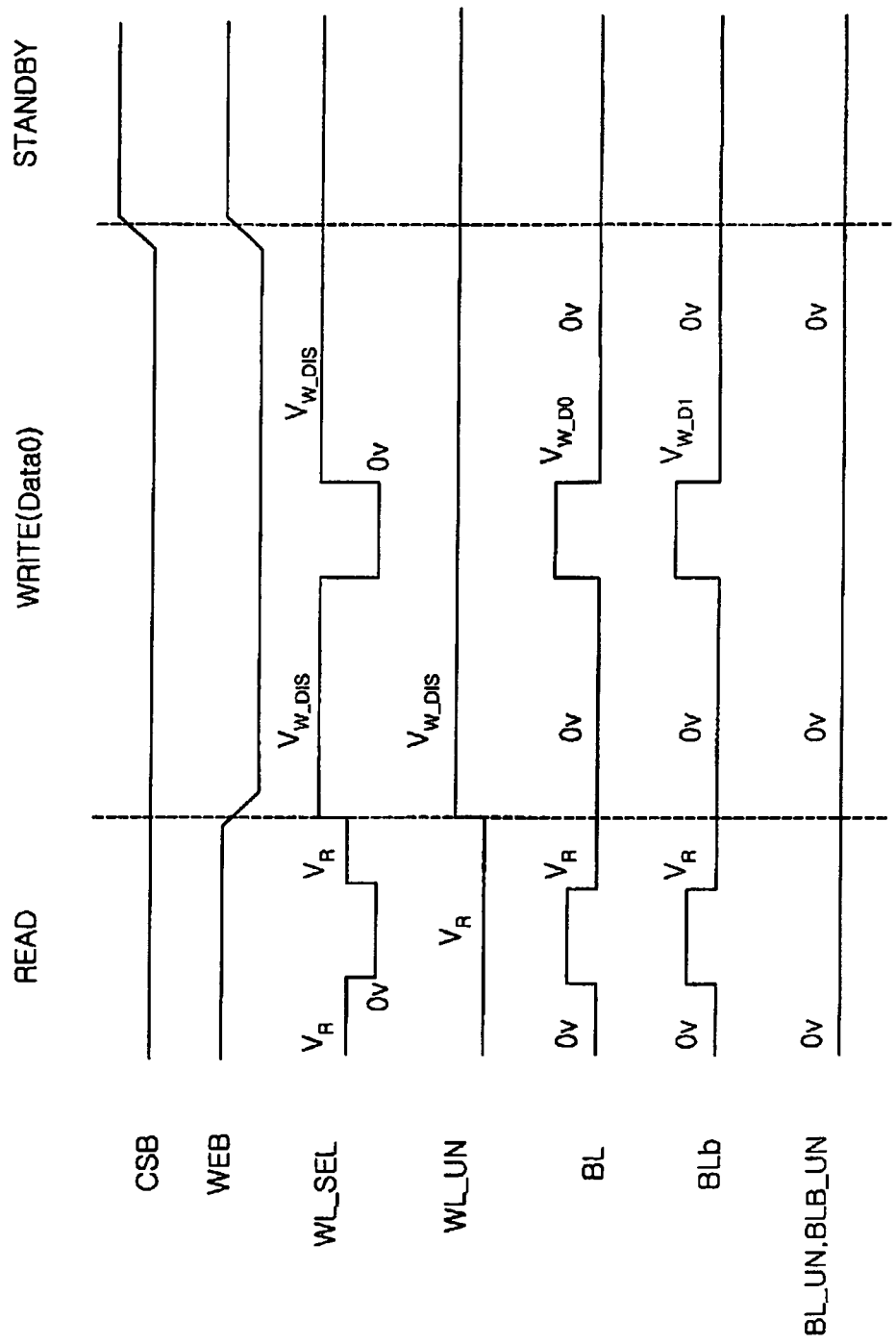

FIGS. 11 and 12 show bias voltages applied to a main bit line BL, a sub bit line BLb, and word lines during read and write operations, and during a standby state. FIG. 13 is a timing diagram for read and write operations, and for a standby state. Hereinafter, read and write operations and the standby state will be described with reference to FIGS. 11 to 13. In addition, parts a, b, and c of FIG. 11 may be referred to herein as FIGS. 11A, 11B, and 11C, respectively, and parts a, b, and c of FIG. 12 may be referred to herein as FIGS. 12A, 12B, and 12C, respectively. As used herein, when a write or read operation is performed, a memory cell on which the write or read operation is performed may be referred to herein as a "selected" memory cell, and the memory cells on which the write or read operation is not performed may be referred to as "unselected" memory cells.

A read operation will now be described. As shown in FIG. 13, when a chip selector signal CSB is enabled when the read operation begins, a read bias voltage $V_R$ is applied to both a main bit line BL and a sub bit line BLb corresponding to a selected memory cell TM. In addition, a ground voltage 0V is applied to a selected word line WL_SEL corresponding to selected memory cell TM. Then, the ground voltage is applied to all unselected bit lines BL_UN and BLb_UN and read bias voltage $V_R$ is applied to all unselected word lines WL_UN. Then, when the read operation for selected memory cell TM is complete, read bias voltage $V_R$ is applied to all word lines WL (i.e., word lines WL_SEL and WL_UN) and ground voltage 0V is applied to all the bit lines BL, BLb (i.e., bit lines BL, BLb, BL_UN, and BLb_UN). In FIG. 13, chip selector signal CSB is enabled when it has a logic low level.

Referring to FIG. 12A, a read bias voltage $V_R$ is applied to selected main bit line BL and selected sub bit line BLb, and the ground voltage is applied to selected word line WL_SEL. Accordingly, a current path from selected main bit line BL to selected word line WL_SEL and a current path from selected sub bit line BLb to selected word line WL_SEL are formed to perform the read operation.

In addition, for an unselected memory cell that is connected to selected main bit line BL and selected sub bit line BLb, the read bias voltage is applied to the unselected word line WL_UN connected to the unselected memory cell. This is done to prevent a current path from forming from selected main bit line BL to unselected word line WL_UN and to prevent a current path from forming from selected sub bit line BLb to unselected word line WL_UN since read bias voltage VR is applied to both selected main bit line BL and selected sub bit line BLb.

FIG. 12B shows the bias voltages applied to an unselected main bit line BL, an unselected sub BLb, a selected word line WL_SEL, and an unselected word line WL_UN, wherein two unselected memory cells are connected to those bit lines, one of the memory cells is connected to selected word line WL_SEL, and the other one of the memory cells is connected to unselected word line WL_UN.

In the example illustrated in FIG. 12B, the ground voltage 0V is applied to selected word line WL_SEL. In addition, applying the ground voltage 0V to both main bit line BL and sub bit line BLb prevents the formation of a current path. In the example illustrated in FIG. 12B, read bias voltage $V_R$ is applied to unselected word line WL_UN.

FIG. 12C shows the bias voltages applied to unselected main and sub bit lines BL and BLb connected to two memory cells and unselected word lines WL_UN also connected to those memory cells. In the example shown in FIG. 12C, the ground voltage 0V is applied to main bit line BL and sub bit line BLb and the read bias voltage $V_R$ is applied to both unselected word lines WL_UN to prevent the formation of a current path.

An exemplary write operation in which the data value "0" is written to a memory cell will now be described. As shown in FIG. 13, the write operation is begun by enabling a write enable signal WEB, that is, by changing the logic level of write enable signal WEB to the "enabled" logic level at which the chip selector signal CSB is maintained.

In this example, a main bias voltage $V_{W\_D0}$ is applied to the selected main bit line BL connected to the selected memory cell, and a sub bias voltage $V_{W\_D1}$ is applied to the selected sub bit line BLb connected to the selected memory cell. Further, the ground voltage 0V is applied to the selected word line WL_SEL, which is the word line connected to the selected memory cell. Accordingly, a write current path is formed from the selected main bit line BL to the selected word line WL_SEL and a write current path is also formed from the selected sub bit line BLb to the selected word line WL_SEL in order to perform the write operation.

In addition, the ground voltage 0V is applied to all unselected bit lines BL_UN and BLb_UN, and a disable voltage $V_{W\_DIS}$ is applied to all unselected word lines WL_UN. Disable voltage $V_{W\_DIS}$ may have a voltage level that is higher than the voltage level of main bias voltage $V_{W\_D0}$ and sub bias voltage $V_{W\_D1}$. Disable voltage $V_{W\_DIS}$ has a relatively high voltage level to prevent a current path from forming between either the selected main bit line BL and an unselected word line WL_UN or the selected sub bit line BLb and an unselected word line WL_UN.

Referring to FIG. 13, in a standby state of a resistive semiconductor memory device in accordance with an embodiment of the invention (i.e., in a state in which chip selector signal CSB and write enable signal WEB are disabled), disable voltage $V_{W\_DIS}$ is applied to all word lines WL and the ground voltage 0V is applied to all main and sub bit lines BL and BLb. FIG. 13 shows the device entering a standby state after the write operation is complete.

FIG. 11A shows the bias voltages applied to bit lines and word lines corresponding to two memory cells in an exemplary write operation in which the data value "0" is written to a selected one of the two memory cells. During the exemplary write operation, a main bias voltage $V_{W\_D0}$ is applied to selected main bit line BL, and a sub bias voltage $V_{W\_D1}$ is applied to sub bit line BLb. Further, the ground voltage 0V is applied to a selected word line WL_SEL connected to the selected memory cell.

In addition, the unselected memory cell of the two memory cells is connected to the selected main bit line BL, the selected sub bit line BLb, and an unselected word line WL_UN. Disable voltage $V_{W\_DIS}$ is applied to the unselected word line WL_UN to prevent a current path from forming from selected main bit line BL (to which main bias voltage $V_{W\_D0}$ is applied) to unselected word line WL_UN and to prevent a current path from forming from selected sub bit line BLb (to which sub bias voltage $V_{W\_D1}$ is applied) to unselected word line WL_UN.

FIG. 11B shows the bias voltages applied to bit lines and word lines corresponding to two memory cells in an exemplary write operation in which the data value "1" is written to a selected one of the two memory cells. A main bias voltage $V_{W\_D1}$ is applied to selected main bit line BL, and a sub bias voltage $V_{W\_D0}$ is applied to sub bit line BLb. The selected memory cell is connected to both selected main bit line BL and selected sub bit line BLb. Further, the ground voltage 0V is applied to a selected word line WL_SEL connected to the selected memory cell.

In addition, the unselected memory cell of the two memory cells is connected to the selected main bit line BL, the selected sub bit line BLb, and an unselected word line WL_UN. Disable voltage $V_{W\_DIS}$ is applied to the unselected word line WL_UN to prevent a current path from forming from selected main bit line BL (to which main bias voltage $V_{W\_D1}$ is applied) to unselected word line WL_UN and to prevent a current path from forming from selected sub bit line BLb (to which sub bias voltage $V_{W\_D0}$ is applied) to unselected word line WL_UN.

FIG. 11C shows the bias voltages applied to word lines and unselected bit lines connected to two unselected memory cells, wherein a selected word line WL_SEL is connected to one of the memory cells and an unselected word line WL_UN is connected to the other memory cell. In the example illustrated in FIG. 11C, the ground voltage 0V is applied to the unselected main word line BL, the unselected sub word line BLb, and the selected word line WL_SEL.

The ground voltage 0V is applied to unselected main bit line BL and unselected sub bit line BLb to prevent a current path from forming between unselected main bit line BL and selected word line WL_SEL and to prevent a current path from forming between unselected sub bit line BLb and selected word line WL_SEL. In addition, when main bit line BL and sub bit line BLb are not selected, disable voltage $V_{W\_DIS}$ is applied to unselected word line WL_UN.

Each of the memory cells described above with reference to FIGS. 9 through 13 may have a structure analogous to that of memory cell TM of FIGS. 2 and 3.

A resistive semiconductor memory device, in accordance with an embodiment of the invention, having a three-dimensional stack structure may sense a data value stored in a memory cell more reliably than a conventional resistive semiconductor memory device. Thus, a resistive semiconductor memory device in accordance with an embodiment of the invention may have improved reliability. Further, because a resistive semiconductor memory device in accordance with an embodiment of the invention may have a relatively high degree of integration because it has a three-dimensional stack structure.

A resistive semiconductor memory device in accordance with an embodiment of the invention may be an RRAM device, an MRAM device, or a PRAM device, and features of embodiments of the invention may be applied to any semiconductor memory device having memory cells comprising resistors and diodes.

Although embodiments of the invention have been described herein, modifications may be made to those embodiments by one of ordinary skill in the art without departing from the scope of the invention as defined by the accompanying claims.

What is claimed is:

1. A memory cell of a resistive semiconductor memory device, the memory cell comprising a twin cell, the twin cell comprising:
   a main unit cell connected to a main bit line and a word line, and comprising a first variable resistor and a first diode, wherein a first terminal of the first variable resistor is connected to the main bit line and a second terminal of the first variable resistor is connected to the first diode and the first diode comprises a cathode connected to the word line and an anode connected to the first variable resistor; and
   a sub unit cell connected to a sub bit line and the word line, and comprising a second variable resistor and a second diode,
   wherein the twin cell stores data values representing one bit of data.

2. The memory cell of claim 1, wherein:
   a first terminal of the second variable resistor is connected to the sub bit line and a second terminal of the second variable resistor is connected to the second diode; and,
   the second diode comprises a cathode connected to the word line and an anode connected to the second variable resistor.

3. The memory cell of claim 1, wherein:
   the main bit line and the sub bit line each extend in a first direction;
   the word line extends in a second direction orthogonal to the first direction; and,
   the main unit cell and the sub unit cell are separated from one another along a third direction orthogonal to the first and second directions.

4. A resistive semiconductor memory device having a three-dimensional stack structure, the resistive semiconductor memory device comprising:
   a plurality of bit line layers comprising a plurality of main bit line layers and a plurality of sub bit line layers alternately stacked in a vertical direction, wherein each of the plurality of main bit line layers comprises a plurality of main bit lines extending in a first direction and each of the sub bit line layers comprises a plurality of sub bit lines extending in the first direction, the bit line layers being adjacent to another along a third direction orthogonal to the first and second direction;
   a plurality of memory cell layers each disposed between corresponding main and sub bit line layers and comprising a plurality of memory cells each comprising a main unit cell and a sub unit cell, wherein the main unit cell and sub unit cell is a twin cell storing data values representing one bit of data; and,
   a plurality of word line layers extending in a second direction orthogonal to the first direction and the vertical direction in the plurality of memory cell layers, respectively, and each comprising a plurality of word lines each shared by and disposed between main unit cells and sub unit cells of a predetermined of corresponding memory cells.

5. The semiconductor memory device of claim 4, wherein:
   the main unit cell comprises a first variable resistor and a first diode; and,
   the sub unit cell comprises a second variable resistor and a second diode.

6. The semiconductor memory device of claim 5, wherein:
   a first terminal of the first variable resistor is connected to a corresponding main bit line;
   a second terminal of the first variable resistor is connected to the first diode; and,
   the first diode comprises a cathode connected to a corresponding word line and an anode connected to the first variable resistor.

7. The semiconductor memory device of claim 5, wherein:
   a first terminal of the second variable resistor is connected to a corresponding sub bit line;
   a second terminal of the second variable resistor is connected to the second diode; and
   the second diode comprises a cathode connected to a corresponding word line and an anode connected to the second variable resistor.

8. The semiconductor memory device of claim 4, wherein:
   two sub unit cells separated along the third direction by a sub bit line layer share a sub bit line of the sub bit line layer; and
   two main unit cells separated along the third direction by a main bit line layer share a main bit line of the main bit line layer.

9. The semiconductor memory device of claim 4, further comprising a vertical decoder selecting two adjacent bit line layers of the plurality of bit line layers by generating two decoding signals in response to a vertical address corresponding to the two adjacent bit line layers.

10. The semiconductor memory device of claim 4, wherein the resistive semiconductor memory device is a resistive random access memory (RRAM) or a phase change random access memory (PRAM).

11. A resistive semiconductor memory device having a three-dimensional stack structure, the resistive semiconductor memory device comprising:
a plurality of array block layers each comprising a main bit line layer, a memory cell layer comprising a main unit cell layer, a sub unit cell layer, and a word line layer interposed therebetween and shared thereby, and a sub bit line layer sequentially stacked,
wherein:
in each of the plurality of array block layers,
the main bit line layer comprises a plurality of main bit lines extending in a first direction,
the sub bit line layer comprises a plurality of sub bit lines extending in a first direction,
the main unit cell layer comprises a plurality of main unit cells,
the sub unit cell layer comprises a plurality of sub unit cells, and
respective pairs of main and sub unit cells neighboring each other along a vertical direction in each memory cell layer form a twin cell storing data values representing one bit of data.

12. The semiconductor memory device of claim 11, further comprising a vertical decoder selecting the main and sub bit line layers of one of the array block layers by generating a decoding signal in response to a vertical address corresponding to the one of the array block layers.

13. A method for performing a write operation in a semiconductor memory device having a three-dimensional stack structure and comprising a plurality of main bit lines, a plurality of sub bit lines, a plurality of word lines, and a plurality of memory cells each comprising a main unit cell and a sub unit cell sharing one word line, the method comprising:
selecting a main bit line, a sub bit line, and a word line connected to a memory cell to select the memory cell;
applying a main bias voltage corresponding to a data value having a first logic level, a sub bias voltage corresponding a data value having a second logic level opposite to the first logic level, and a ground voltage to the selected main bit line, the selected sub bit line, and the selected word line, respectively, and simultaneously applying the ground voltage, and a disable voltage having a voltage level higher than the main bias voltage to unselected main bit lines, unselected sub bit lines, and unselected word lines, respectively,
wherein the main unit cell is connected to the main bit line and the word line, and comprises a first variable resistor and a first diode, wherein a first terminal of the first variable resistor is connected to the main bit line and a second terminal of the first variable resistor is connected to the first diode, and the first diode comprises a cathode connected to the word line and an anode connected to the first variable resistor.

14. A method for performing a read operation in a semiconductor memory device having a three-dimensional stack structure and comprising a plurality of main bit lines, a plurality of sub bit lines, a plurality of word lines, and a plurality of memory cells each comprising a main unit cell and a sub unit cell sharing one word line, the method comprising:
selecting a main bit line, a sub bit line, and a word line connected to a memory cell to select the memory cell;
applying a read bias voltage to the selected main bit line and the selected sub bit line and a ground voltage to the selected word line, and simultaneously, applying the ground voltage to unselected main bit lines and unselected sub bit lines and the read bias voltage to unselected word lines; and,
comparing a voltage level apparent on the selected main bit line to a voltage level apparent on the selected sub bit line and determining whether the selected memory cell is storing a first data value having a first logic level or a second data value having a second logic level,
wherein the main unit cell is connected to the main bit line and the word line, and comprises a first variable resistor and a first diode, wherein a first terminal of the first variable resistor is connected to the main bit line and a second terminal of the first variable resistor is connected to the first diode, and the first diode comprises a cathode connected to the word line and an anode connected to the first variable resistor.

15. The method of claim 14, wherein:
whether the selected memory cell is storing the first data value or the second data value is determined on the basis of whether the main unit cell of the selected memory cell is storing the first data value or the second data value.

16. The method of claim 14, wherein:
whether the selected memory cell is storing the first data value or the second data value is determined on the basis of whether the sub unit cell of the selected memory cell is storing the first data value or the second data value.

17. A resistive semiconductor memory device having a three-dimensional stack structure, the resistive semiconductor memory device comprising:
a first pair of bit line layers comprising a first main bit line layer and a first sub bit layer, each of the first main bit line layer and first sub bit line layer comprising a plurality of main bit lines extending in a first direction and a plurality of first sub bit lines extending in a first direction;
a first twin memory cell layer disposed between the first pair of bit line layers, the first twin memory cell layer comprising a plurality of twin memory cells each comprising a main unit cell and a sub unit cell stacked in a vertical direction, wherein the first twin cell stores data values representing one bit of data;
a first word line layer shared by the first main unit cell and the first sub unit cell, the first word line layer comprising a plurality of word lines extending in a second direction;
a second pair of bit line layers comprising the first sub bit line layer and a second main bit line layer comprising a plurality of second main bit lines extending in a first direction;
a second twin memory cell layer disposed between the second pair of bit line layers, the second twin memory cell layer comprising a plurality of twin memory cells each comprising a main unit cell and a sub unit cell stacked in a vertical direction, wherein the second twin cell stores data values representing one bit of data; and
a second word line layer shared by the second main unit cell and the second sub unit cell, the second word line layer comprising a plurality of word lines extending in a second direction,
wherein the first sub bit line layer is shared by the first sub unit cell of the first twin cell and the second sub unit cell of the second twin cell.

* * * * *